(12) United States Patent
Okamura et al.

(10) Patent No.: US 6,649,020 B1
(45) Date of Patent: Nov. 18, 2003

(54) PLASMA PROCESSING APPARATUS

(75) Inventors: Ryuji Okamura, Kyoto-fu (JP);
Tatsuyuki Aoike, Nara-ken (JP);
Toshiyasu Shirasuna, Nara-ken (JP);
Kazuhiko Takada, Nara-ken (JP);
Kazuyoshi Akiyama, Nara-ken (JP);
Hitoshi Murayama, Kyoto-fu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/897,961

(22) Filed: Jul. 5, 2001

Related U.S. Application Data

(62) Division of application No. 09/270,211, filed on Mar. 15, 1999, now Pat. No. 6,300,225.

(30) Foreign Application Priority Data

Mar. 13, 1998 (JP) .............................. 10-080550
Dec. 3, 1999 (JP) .............................. 11-066703

(51) Int. Cl.⁷ .............................. C23C 16/00; C23F 1/00
(52) U.S. Cl. .............................. 156/345.31; 156/345.43; 156/345.1; 118/719; 118/723 E; 118/723 R
(58) Field of Search .............................. 118/719, 723 R, 118/723 E, 723 ER, 723 I, 723 IR, 723 AN, 723 MW, 723 ME, 723 MR, 723 MA; 156/345, 345.1, 345.31, 345.32, 345.41, 345.43, 345.46, 345.47, 345.48, 345.49; 204/298.25, 298.35

(56) References Cited

U.S. PATENT DOCUMENTS

| 2,730,987 A | 1/1956 | Nelson et al. ............... 118/704 |
|---|---|---|
| 4,576,830 A * | 3/1986 | Kiss ............................. 427/569 |
| 4,637,342 A | 1/1987 | Kamiya et al. ............. 118/719 |
| 4,650,736 A | 3/1987 | Saitoh et al. .................. 430/57 |
| 4,696,844 A | 9/1987 | Spector ........................ 428/46 |
| 4,705,733 A | 11/1987 | Saitoh et al. .................. 430/57 |
| 4,735,883 A | 4/1988 | Honda et al. .................. 430/69 |
| 4,972,799 A | 11/1990 | Misumi et al. ............. 118/723 |
| 5,076,205 A | 12/1991 | Vowles et al. .............. 118/719 |
| 5,116,640 A * | 5/1992 | Mikami et al. ............. 427/569 |
| 5,288,329 A * | 2/1994 | Nakamura et al. .......... 118/715 |
| 5,314,538 A * | 5/1994 | Maeda et al. ................ 118/715 |
| 5,364,219 A * | 11/1994 | Takahashi et al. .......... 118/719 |
| 5,773,088 A | 6/1998 | Bhat .......................... 427/294 |
| 5,979,306 A * | 11/1999 | Fujikawa et al. ........... 100/305 |
| 6,153,013 A * | 11/2000 | Sakai et al. ................. 118/719 |
| 6,273,955 B1 * | 8/2001 | Yoshino et al. ............. 118/718 |

FOREIGN PATENT DOCUMENTS

JP          09-199429 A    *   7/1997

* cited by examiner

*Primary Examiner*—Luz L. Alejandro
(74) *Attorney, Agent, or Firm*—Fitzpatrick, Cella, Harper & Scinto

(57) ABSTRACT

A plasma processing method comprising the steps of arranging a substrate on a film is to be formed in a reaction chamber capable of being vacuumed and evacuating the inside of the reaction chamber in a loading stage; and separating the reaction chamber from the loading stage and joining the reaction chamber to a treating stage where the substrate arranged in the reaction chamber is subjected to plasma processing, wherein the reaction chamber is moved on a track to join to the treating stage, where a high frequency power supply system, a processing gas supply system and an exhaustion system are joined to the reaction chamber, whereby plasma is produced in the reaction chamber to conduct plasma processing on the substrate. An apparatus suitable for practicing said plasma processing method.

7 Claims, 7 Drawing Sheets

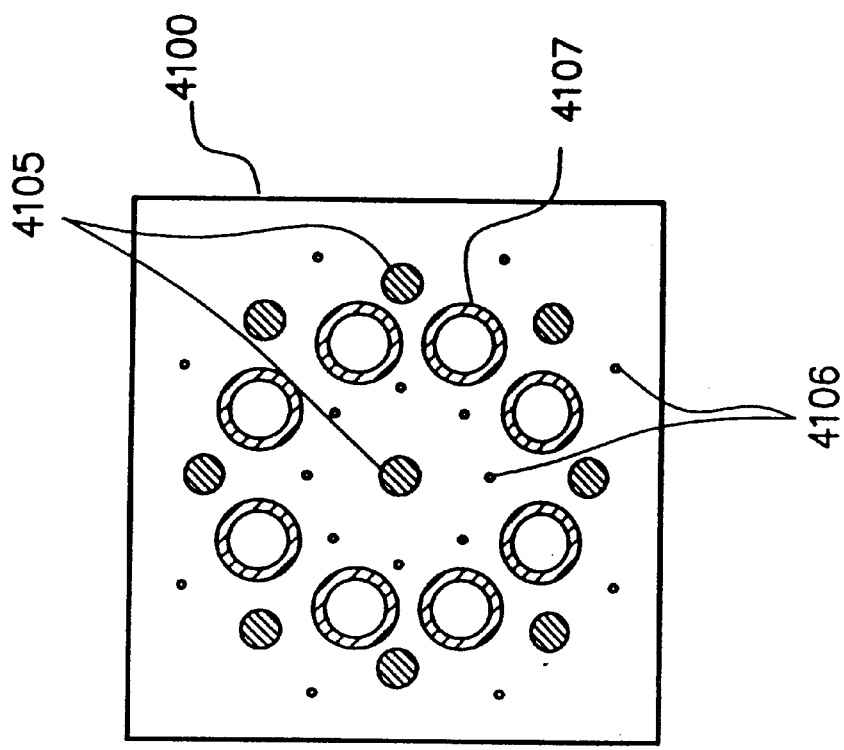
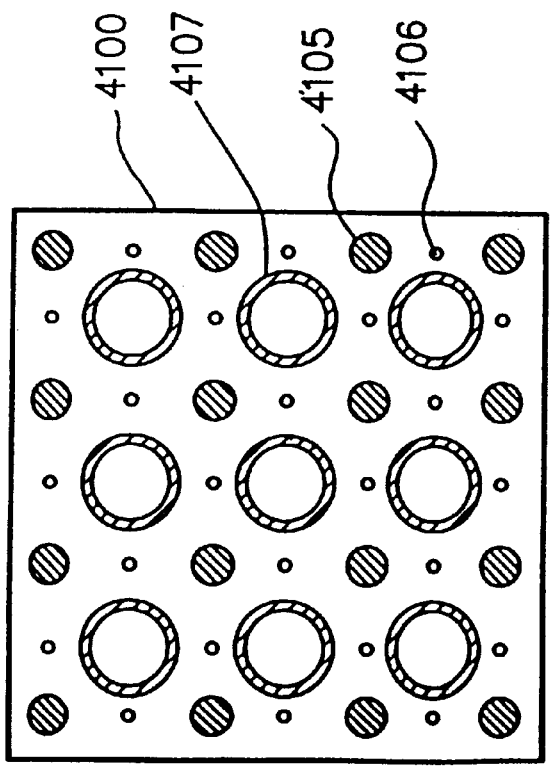

PLASMA PROCESSING APPARATUS

This application is a division of application Ser. No., 09/270,211, filed Mar. 15, 1999, now U.S. Pat. No. 6,300,225.

BACKGROUND OF THE INVENTION

1. Field of the Invention

The present invention relates to a plasma processing method and apparatus. Particularly, the present invention relates to a plasma processing method employed typically in film deposition, etching treatment, and the like. The plasma processing method employed in film deposition specifically includes a plasma CVD film-forming method for forming a semiconductor film or a insulator film usable in the production of semiconductor devices such as electrophotographic light receiving members (or electrophotographic photosensitive members), photovoltaic elements (including solar cells), image input line sensors, image pickup devices, and the like. The present invention also relates to a plasma processing apparatus suitable for practicing said plasma processing method.

2. Related Background Art

For the photoconductive material to constitute a light receiving layer in a light receiving member which is used in the field of electrophotographic image formation, it is required to be highly sensitive, to have a high SN ratio [photocurrent (Ip)/dark current (Id)], to have an absorption spectrum compatible for the spectrum characteristics of an electromagnetic wave to be irradiated, to have a quick photoresponsibility and to have a desired dark resistance. It is also required to be not harmful to living things as well as human upon use. Especially in the case where the light receiving member is used as an electrophotographic light receiving member which is installed in an electrophotographic apparatus as a business machine in offices, causing no pollution is indeed important.

From these standpoints, there have been proposed a variety of electrophotographic light receiving members comprising an amorphous silicon (a-Si) material compensated by, for instance, hydrogen atoms (H) or/and halogen atoms (X) (such as fluorine atoms, chlorine atoms, or the like. Some of these electrophotographic light receiving members already have been put to practical use. [The electrophotographic light receiving member comprising such a-Si material will be hereinafter referred to as "a-Si electrophotographic light receiving member".]

Such a-Si material substantially satisfies all the above described requirements and excels in durability. Therefore, the a-Si material is an excellent constituent material of the electrophotographic light receiving member.

However, in comparison with a so-called OPC electrophotographic light receiving member comprising an organic semiconductor material (an organic photoconductive (OPC) material in other words) which has been widely spread in recent years, the a-Si photoelectric light receiving member is relatively costlier. In view of this, there is an increased demand for developing a highly productive film-forming method and apparatus which enables one to stably mass-produce high quality a-Si electrophotographic light receiving members.

Now, for the formation of an amorphous silicon (a-Si) deposited film, there have been proposed various film-forming methods. Of these film-forming methods, so-called plasma CVD film-forming methods in which a given raw material gas is decomposed by means of an electric field of D.C., RF, VHF (very high frequency) or MW (microwave) to form a deposited film on a substrate have been popularized, for the reason that according to these plasma CVD film-forming methods, a desired large area deposited film can be relatively easily formed.

In addition, in recent years, there have been proposed some plasma CVD apparatus in which such plasma CVD film-forming method is practiced, which are aimed at improving the productivity of forming a deposited film. For instance, U.S. Pat. No. 4,972,799 discloses a plasma CVD film-forming apparatus by a microwave plasma CVD process (that is, a microwave plasma CVD film-forming apparatus) which is characterized by having a holding member, which is capable of holding a microwave introducing window and a plurality of substrates concentrically arranged around the microwave introducing window and which is capable of sealing a deposition chamber in a air-tight state upon film formation, and a means for transporting said holding member under vacuum condition. In this document, there is described as follows. That is, the microwave plasma CVD film-forming apparatus is provided with a plurality of deposition chambers and a movable vacuum vessel which serves to assemble a microwave introducing means including said microwave introducing window and said substrates onto said holding member. The assemble comprising the microwave introducing means and the substrates fixed onto the holding member is transported into one of the deposition chambers under vacuum condition through the movable vacuum vessel where the formation of a deposited film on the substrates is conducted, then the assemble after the film formation is taken out from the deposition chamber through the movable vacuum vessel. In the case where further film formation is desired, the assemble is transported into other deposition chamber in the same manner as described above. In this way, there can be mass-produced deposited films.

According to this microwave plasma CVD film-forming apparatus, since the film formation in each deposition chamber can be continuously conducted without breaking the vacuum and while preventing contamination of dust, an improvement in the productivity and quantity production of deposited film can be attained to a certain extent and the mass-production of deposited films having an improved quality can be attained.

However, in this microwave plasma CVD film-forming apparatus, there is a limit to a certain extent for the film formation cycle, because the speed for the holding member to be transported into a given deposition chamber has a limitation because it unavoidably takes a certain period of time upon precisely positioning the holding member and the like as required. In addition, there is a disadvantage such that in the case of heating the substrates on the holding member prior to the film formation or in the case where after the holding member is transported into a given deposition chamber, the substrates thereon are heated and subjected to the film formation, the occupation time of the deposition chamber is prolonged and this situation is inefficient. In order to improve this advantage, it is considered to be effective that a heating vacuum vessel is provided, and after previously heating the substrates on the holding member in this heating vacuum vessel, the holding member is transported into the deposition chamber. However, this manner is not always effective for the reason that since the speed for the holding member to be transported into the deposition chamber has such limitation as above described, during the transportation of the holding member into the deposition chamber, the temperature of the substrates on the holding members is liable to change, resulting in affecting the properties of deposited films formed on the substrates in the deposition chamber.

Separately, in recent years, electrophotographic apparatus have been improved to have a high performance and they have been diversified. Along with this, for electrophotographic light receiving members used in such electrophotographic apparatus, they are necessary to be more improved with respect to their quality so that they can stably and continuously reproduce a high quality image. In addition, they are also necessary to be improved to have variations so as to comply with use purposes.

Further, in recent years, there has been a tendency that the space occupied by business machines including an electrophotographic apparatus in an office is diminished as smaller as possible in order to save the office space for other purposes. In this connection, electrophotographic apparatus have been miniaturized. For electrophotographic light receiving members used in such electrophotographic apparatus, it is indispensably necessary for them to conform such electrophotographic apparatus. In this respect, it is necessary to provide an appropriate electrophotographic light receiving member having a more improved performance at a reasonable cost which can satisfy such demand.

SUMMARY OF THE INVENTION

The present invention is aimed at solving the foregoing disadvantages in the prior art and providing a plasma processing method including a plasma CVD method which excels in productivity and which enables to eliminate such disadvantages in the prior art.

Another object of the present invention is to provide a plasma processing method including a plasma CVD method which enables to stably and efficiently form a high quality functional deposited film (a high quality semiconductor film), which is usable as a constituent in semiconductor devices such as electrophotographic light receiving members (or electrophotographic photosensitive members), photovoltaic elements (including solar cells), image input line sensors, image pickup devices, and the like, particularly, a functional deposited film having excellent image-forming characteristics, at a good productivity and at a reasonable production cost.

A further object of the present invention is to provide a plasma processing apparatus which is suitable for practicing said plasma processing method.

A further object of the present invention is to provide a plasma processing method comprising the steps of arranging a substrate on a film is to be formed in a reaction chamber capable of being vacuumed and evacuating the inside of the reaction chamber in a loading stage; and separating the reaction chamber from the loading stage and joining the reaction chamber to a treating stage where the substrate arranged in the reaction chamber is subjected to plasma processing, wherein the reaction chamber is moved on a track to join to the treating stage, where a high frequency power supply system, a processing gas supply system and an exhaustion system are joined to the reaction chamber, whereby plasma is produced in the reaction chamber to conduct plasma processing on the substrate.

A further object of the present invention is to provide a plasma processing apparatus having a reaction chamber capable of being vacuumed and an exhaust device to which the reaction chamber is capable being joined and from which the reaction chamber is capable of being detached, and having a track for moving the reaction chamber at least in a plasma processing stage.

Incidentally, in the present invention, it is possible for the track comprising, for instance, a rail on which the reaction chamber is moved to be designed such that the rail is provided with a power supply means and an electric power from the power supply means is supplied to a temperature controlling means for the substrate to control the temperature of the substrate. This enables to efficiently conduct improved plasma processing for the substrate. Specifically, high quality light receiving members comprising an amorphous silicon (a-Si) material and having improved electrophotographic characteristics and improved image-forming characteristics can be effectively mass-produced.

In addition, it is possible to control the temperature of a high frequency power supply electrode provided in the reaction chamber by supplying an electric power from the above power supply means provided at the rail to the electrode. In this case, more improved plasma processing can be effectively conducted for the substrate. Specifically, high quality light receiving members comprising an amorphous silicon (a-Si) material and having more improved electrophotographic characteristics and more improved image-forming characteristics can be effectively mass-produced.

Further, in the present invention, it is possible that in the loading stage, a plurality of reaction chambers each having a plurality of substrates arranged therein are stood-by; after plasma processing for a plurality of substrates arranged in the previous reaction chamber in the treating stage (the plasma processing stage) is completed, the successive reaction chamber is joined to the treating stage and the substrates in the reaction chamber are subjected to plasma processing; and by repeating this cycle, the plasma processing for the substrates arranged in the respective reaction chambers is continuously conducted. This enables to improve the production tact time of deposited film products and diminish the initial investment for a fabrication apparatus.

Further in addition, in the present invention, it is possible to mass-produce a variety of amorphous silicon light receiving members in a cylindrical form (the amorphous silicon light receiving member in a cylindrical form will be hereinafter referred to as "amorphous silicon drum"). For instance, in the conventional fabrication apparatus, in the case of producing amorphous silicon drums having a different diameter, there is an unavoidable inefficiency such that a lot of time is required for the stage replacement of the apparatus and the like. However, the present invention is free of such problem. That is, by providing reaction chambers respectively fitting to the diameter of a given cylindrical substrate for the formation of an amorphous silicon drum having a given diameter and making the joining portion in the treating stage to be common for these reaction chambers, amorphous silicon drums having a different diameter can be continuously produced. By this, a variety of amorphous silicon drums can be continuously produced. In this case, the number of silicon drums to be produced can readily be adjusted as desired. And such dead time required for the stage replacement as in the prior art can be neglected. Thus, the production cost of a silicon drum can be reduced as desired.

BRIEF DESCRIPTION OF THE DRAWINGS

FIGS. 5(A) and 5(B) are schematic horizontal cross-sectional views respectively illustrating a example of the internal constitution of a reaction chamber in the present invention.

DETAILED DESCRIPTION OF THE INVENTION

In the following, the present invention will be detained while referring to a case of conducting film formation.

Figure 1:
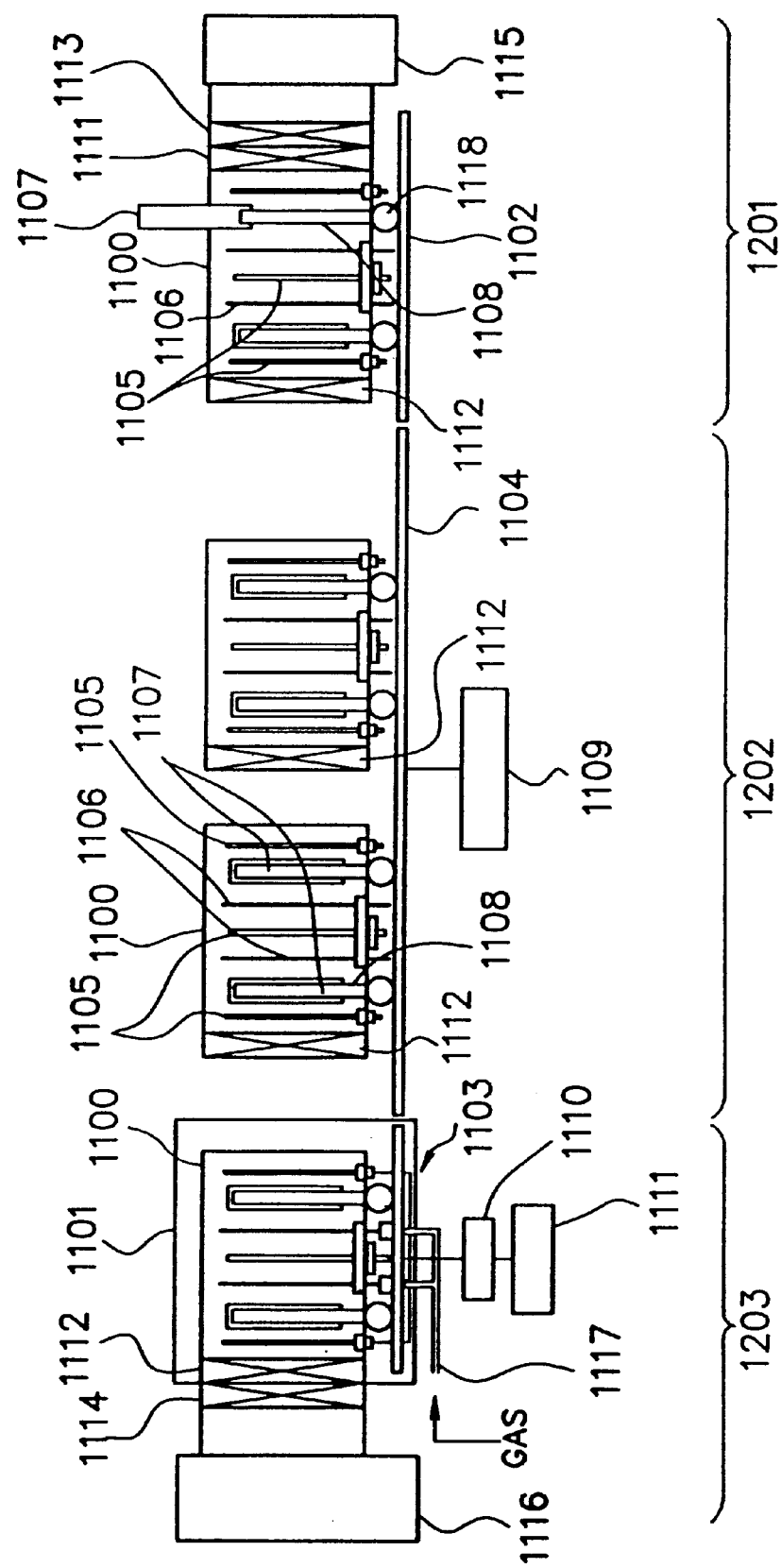
FIGS. 1 and 2 are schematic diagrams respectively illustrating the constitution of an example of a plasma processing apparatus according to the present invention.

FIG. 1 is a schematic diagram illustrating an example of a quantity production type film-forming apparatus which is suitable for practicing the present invention.

An example of the procedure of practicing the present invention will be described with reference to FIG. 1.

In the apparatus shown in FIG. 1, in a reaction chamber 1100 on a track 1102 (a rail), a high frequency power application electrode 1105, a row material gas introduction means 1106 and a substrate temperature-controlling means 1108 are previously arranged. Here, the reaction chamber 1100 is provided with a valve 1112.

First, in a loading stage 1201, after a substrate 1107 (a cylindrical substrate in this case) is set to the substrate temperature-controlling means 1108 in the reaction chamber 1100, the reaction chamber 1100 is joined to an exhaust device 1115. Thereafter, valves 1111 and 1113 are opened and the inside of the reaction chamber 1100 is sufficiently evacuated by means of the exhaust device 1115. After this, the valves 1111 and 1113 are closed, followed by detaching the reaction chamber 1100 from the exhaust device 1115.

In a transfer stage 1202, the reaction chamber 1100 having been evacuated is moved on a travelling rail 1104. The travelling rail 1104 is energized by means of a power source 1109, and an electric power is supplied to the substrate temperature-controlling means 1108 from the travelling rail 1104 to control the temperature of the cylindrical substrate 1107.

The reaction chamber 1100 is moved into a film-forming chamber 1101 in a film-forming stage 1203 while the temperature of the cylindrical substrate 1107 being controlled to a desired value. At the time when the reaction chamber 1100 enters into the film-forming chamber 1101, a valve 1114 is opened and the inside of the film-forming chamber 1101 sufficiently evacuated by means an exhaust device 1116 connected to the film-forming chamber 1101. Then, the reaction chamber 1100 is joined to the exhaust device 1116 through the valves 1112 and 1114, a high frequency power supply system comprising a high frequency power source 1111 and a matching box 1110, and a raw material gas supply system 1117. While evacuating the inside of the film-forming chamber 1101 by means of the exhaust device 1116, the valve 1112 of the reaction chamber 1100 is opened. And a raw material gas and a high frequency power are supplied into the reaction chamber 1100 to conduct film formation on the cylindrical substrate 1107.

After the film formation on the cylindrical substrate 1107 is completed, the reaction chamber 1100 is detached from the respective jointing portions, followed by moving to a taking-out step (not shown). Following this, a next reaction chamber 1100 which is stood-by on the travelling rail 1104 is joined to the film-forming chamber 1110 in the film-forming stage 1203, followed by conducting film formation on the cylindrical substrate in the reaction chamber in the same manner as in the above. Thus, for reaction chambers 1100 provided, by continuously repeating a cycle comprising the loading step, the on-rail transfer step (the substrate temperature-controlling step) and the film-forming step, high quality light receiving members (photosensitive drums) can be effectively mass-produced.

Figure 2:
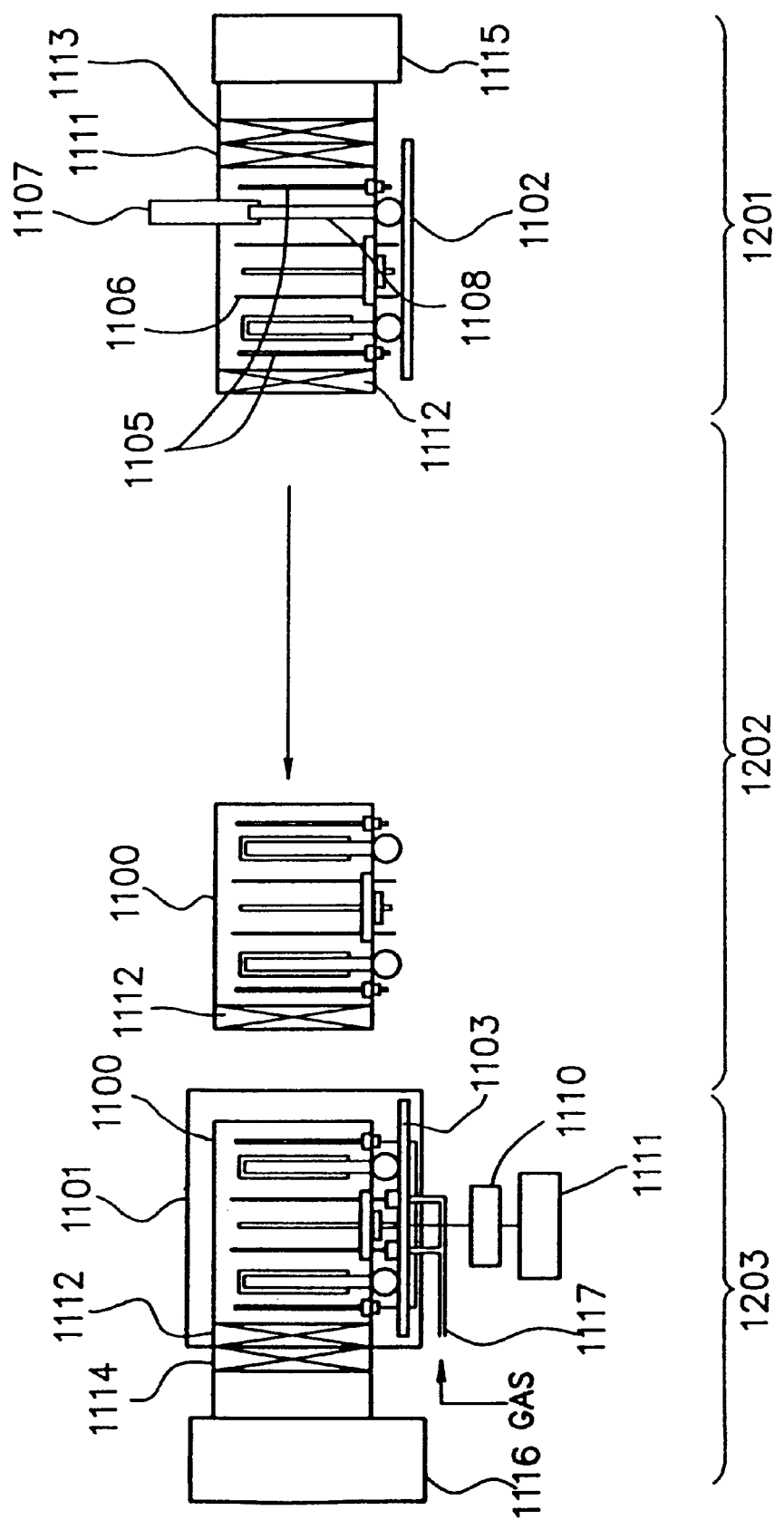

FIG. 2 is a schematic diagram illustrating another example of a quantity production type film-forming apparatus which is suitable for practicing the present invention.

The film-forming apparatus shown in FIG. 2 is different from the film-forming apparatus shown in FIG. 1 with a point that no travelling rail 1104 is not provided in the transfer stage 1202. In the film-forming apparatus shown in FIG. 2, the reaction chamber 1110 is made so that it can be freely moved in the transfer stage 1202. By this, the constitution of the film-forming apparatus can be more freely designed.

Figure 3:
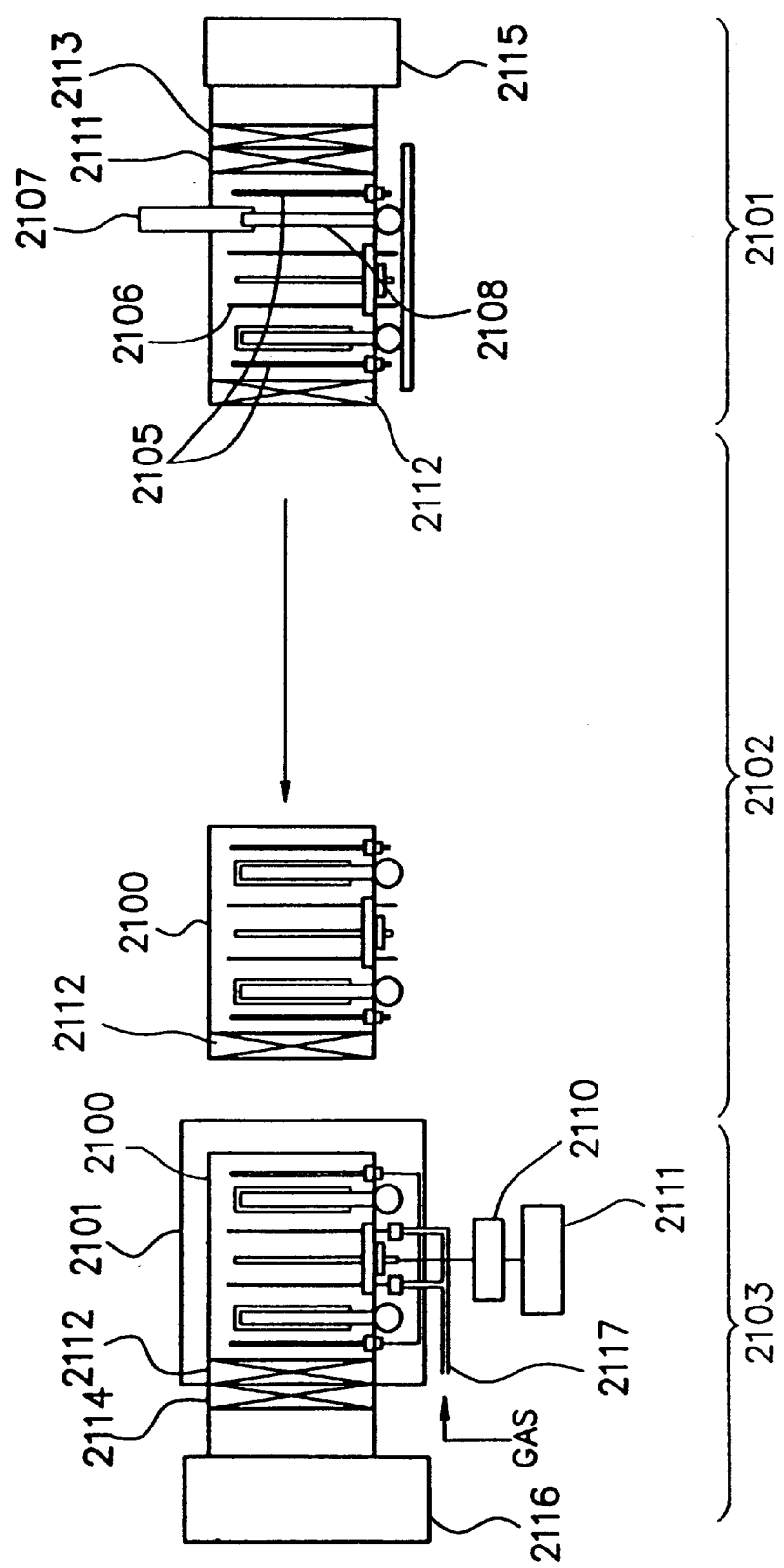
FIGS. 3 and 4 are schematic diagrams respectively illustrating the constitution of an example of a plasma processing apparatus.
Figure 4:
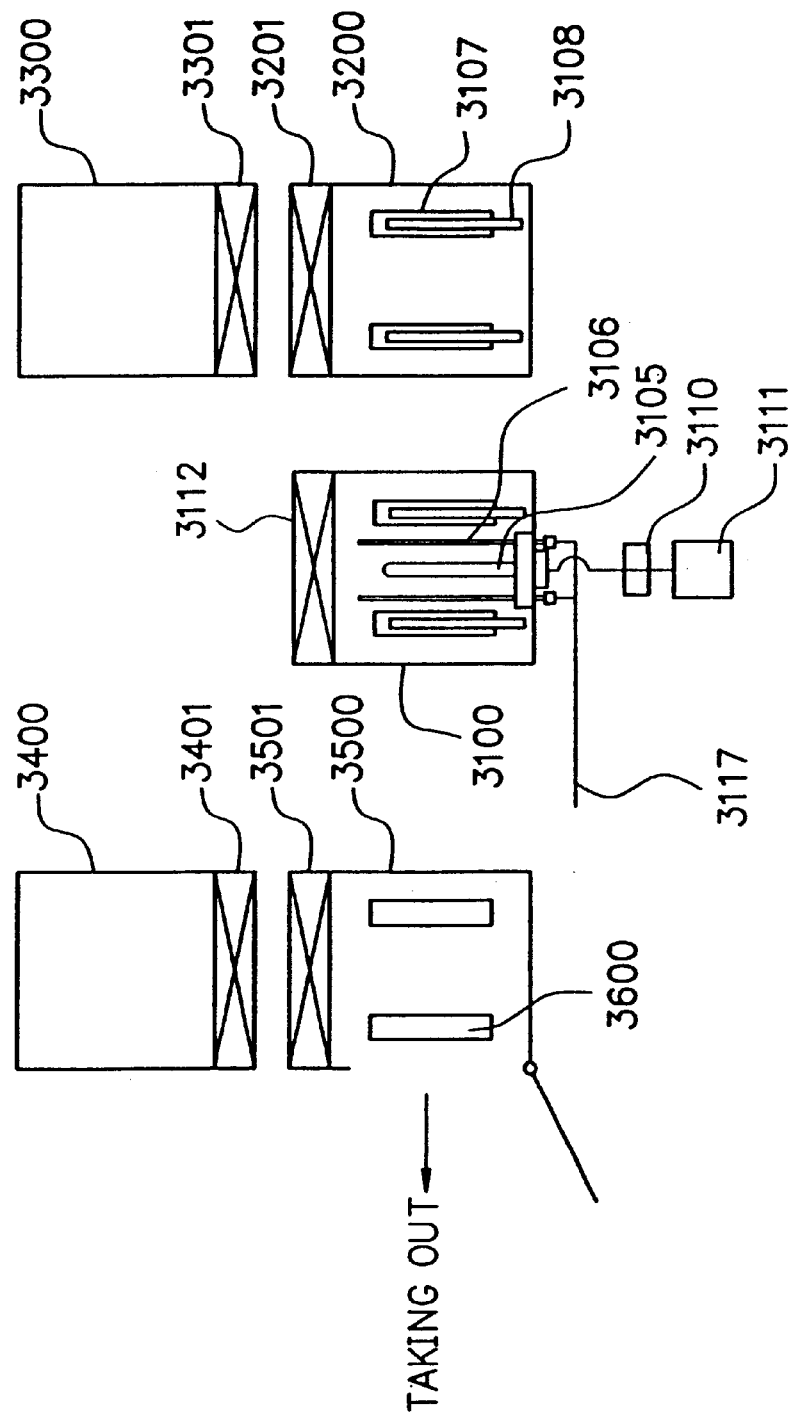

FIGS. 3 and 4 are schematic diagrams respectively illustrating an example of a quantity production type film-forming apparatus in which the system according to the present invention is not used.

The apparatus shown in FIG. 3 is of the type in that a reaction chamber 2100 is manually moved from a loading stage 2101 to a film-forming stage 2103.

In the apparatus shown in FIG. 3, in the reaction chamber 2100, a high frequency power application electrode 2105, a row material gas introduction means 2106 and a substrate temperature-controlling means 2108 are previously arranged. Here, the reaction chamber 2100 is provided with a valve 2112.

First, in the loading stage 2101, after a cylindrical substrate 2107 is set to the substrate temperature-controlling means 2108 in the reaction chamber 2100, the reaction chamber 2100 is joined to an exhaust device 2115. Thereafter, valves 2111 and 2113 are opened and the inside of the reaction chamber 2100 is sufficiently evacuated by means of the exhaust device 2115, followed by heating the cylindrical substrate to a desired temperature by means of the the substrate temperature-controlling means 2108. After this, the valves 1111 and 1113 are closed, followed by detaching the reaction chamber 2100 from the exhaust device 2115.

The reaction chamber 2100 having been evacuated is moved in a manually moving manner in a transfer stage 2102, followed by manually moving the reaction chamber 2100 until a prescribed position in a film-forming chamber 2101 in the film-forming stage 2103. Then, a valve 2114 is opened and the inside of the film-forming chamber 2101 sufficiently evacuated by means an exhaust device 2116 connected to the film-forming chamber 2101, and the valve 2112 of the reaction chamber 2100 is joined to the valve 2114 of the film-forming chamber 2101. Then, the reaction chamber 2100 is joined to a high frequency power supply system comprising a high frequency power source 2111 and a matching box 2110, and a raw material gas supply system 2117. After the reaction chamber 2100 is joined to the respective systems, the valve 2112 of the reaction chamber 2100 is opened to evacuate the inside of the reaction chamber 2100 by means of the exhaust device 2116. While evacuating the inside of the reaction chamber 2100 in this way, a raw material gas and a high frequency power are supplied into the reaction chamber 2100 to conduct film formation on the cylindrical substrate 2107.

After the film formation on the cylindrical substrate 2107 is completed, the reaction chamber 2100 is detached from the respective jointing portions, followed by moving to a taking-out step (not shown). Following this, a next reaction chamber 1100 which is stood-by for the next film formation is manually moved and it is joined to the film-forming chamber 2110 in the film-forming stage 2103, followed by conducting film formation on the cylindrical substrate in the reaction chamber in the same manner as in the above. Thus, for reaction chambers 2100 provided, by continuously repeating a cycle comprising the loading step (including the substrate heating step), the transfer step and the film-forming step, light receiving members (photosensitive drums) can be mass-produced.

FIG. 4 is a schematic diagram illustrating another quantity production type film-forming apparatus improved so as to shorten the occupation time of a film-forming chamber 3100.

In the film-forming apparatus shown in FIG. 4, a cylindrical substrate 3107 fixed on a substrate temperature-controlling means 3108 is introduced into a heating chamber 3200 and the inside of the heating chamber 3200 is evacuated. In the heating chamber 3200, the cylindrical substrate 3107 is heated to a desired temperature by means of the substrate temperature-controlling means 3108. Then, the cylindrical substrate 3107 is transported into the film-forming chamber 3100 using a transportation chamber 3300, where film formation on the cylindrical substrate 3107 is conducted as well as in the above case. After the film formation is completed, the cylindrical substrate 3107 is taken out from the film-forming chamber 3100 through a transportation chamber 3400, followed by transporting into a take-out chamber 3500, where a light receiving member product 3600 (a photosensitive drum) is taken out to the outside.

In any of the quantity production type film-forming apparatus shown in FIGS. 3 and 4, there are disadvantages such that during the time when the substrate is moved into the film-forming chamber, the temperature of the substrate is liable to decrease and a variation in the initial substrate temperature at the time of commencing the film formation is liable to occur.

And particularly in the case of the apparatus shown in FIG. 3, there is an additional disadvantage such that the positioning work at the film-forming chamber and the joining work for the respective joining portions are differed depending on a worker involved with respect to the time required to do. In order to prevent such temperature change of the substrate due to the variation in the time until the reaction chamber is joined as desired in the film-forming chamber, it is considered to employ a manner of shortening the transportation time of the reaction chamber or a manner of providing a transportation chamber provided with a substrate heating means. However, any of these manners is not practical because the constitution of the apparatus is complicated.

On the other hand, according to the present invention, also during the time when the reaction chamber 1100 is moved on the travelling rail 1104, the temperature of the cylindrical substrate can be desirably controlled, and therefore, occurrence of a variation in the initial substrate temperature at the time of commencing the film formation can be sufficiently prevented. This situation enables to stably and continuously mass-produce high quality light receiving members (photosensitive drums). In addition, in the present invention, it is not necessary to use any vacuum transportation mechanism, and because of this, the initial investment can be diminished. Further, in the present invention, for the constituents (such as the inner wall of the reaction chamber, the high frequency power application electrode 1105, and the like) in the reaction chamber other than the cylindrical substrate can be readily heated as desired by the electric power supplied from the travelling rail prior to the film formation. This situation enables to improve the adhesion of a film deposited on the constituents in the reaction chamber other than the cylindrical substrate, where such film deposited on the constituents in the reaction chamber is prevented from being peeled and contaminated into a deposited film formed on the cylindrical substrate. Thus, there can be stably and continuously mass-produced high quality light receiving members (photosensitive drums) having satisfactory characteristics.

For the reaction chamber 1100 in the present invention, as long as it is structured so that the high frequency power application electrode 1105, the raw material gas introduction means 1106 and the substrate temperature-controlling means 1108 on which the cylindrical substrate 1107 is held can be arranged as desired and the inside can be vacuumed, there is no particular limitation for the configuration, constituent material, constitution, and the like. In order to uniformly form a high quality deposited film on the entire surface of each of a plurality of cylindrical substrates at the same time, the internal constitution of the reaction chamber can be designed, for instance, as shown in FIG. 5(A) or FIG. 5(B). Each of FIGS. 5(A) and 5(B) is a schematic horizontal cross-sectional view illustrating an arrangement example of high frequency power application electrodes, raw material gas introduction means and cylindrical substrates in the reaction chamber. In FIGS. 5(A) and 5(B), reference numeral 4100 indicates a reaction chamber, reference numeral 4105 a high frequency power application electrode, reference numeral 4106 a raw material gas introduction means, and reference numeral 4107 a cylindrical substrate.

In the present invention, the reaction chamber 1100 in any case is necessary to be designed so that it can move on the travelling rail 1104 and the electric power from the travelling rail can be supplied to the reaction chamber. In order to satisfy these requirements, for instance, as shown in FIG. 1, it is possible for the reaction chamber to be provided with electrically conductive wheels 1118 so that the electric power from the travelling rail can be supplied to the substrate temperature-controlling means 1108 in the reaction chamber 1100 through the electrically conductive wheels 1118.

In the present invention, the film-forming stage 1203 comprises the film-forming chamber 1101, the raw material gas supply system 1117 and the high frequency power supply system comprising the high frequency power source 1111 and the matching box 1110. It is desired for these supply systems to be joined to the reaction chamber 1100 at a position where the reaction chamber is joined to the exhaust device 1116. Further, particularly for safety reasons, it is desired that the evacuation of the inside of the film-forming chamber 1101 is continued from the time when the respective supply systems and the exhaust device are connected to the reaction chamber until the time when the film formation is completed, the high frequency power source is switched off, and the supply of the raw material gas is terminated.

Figure 6:
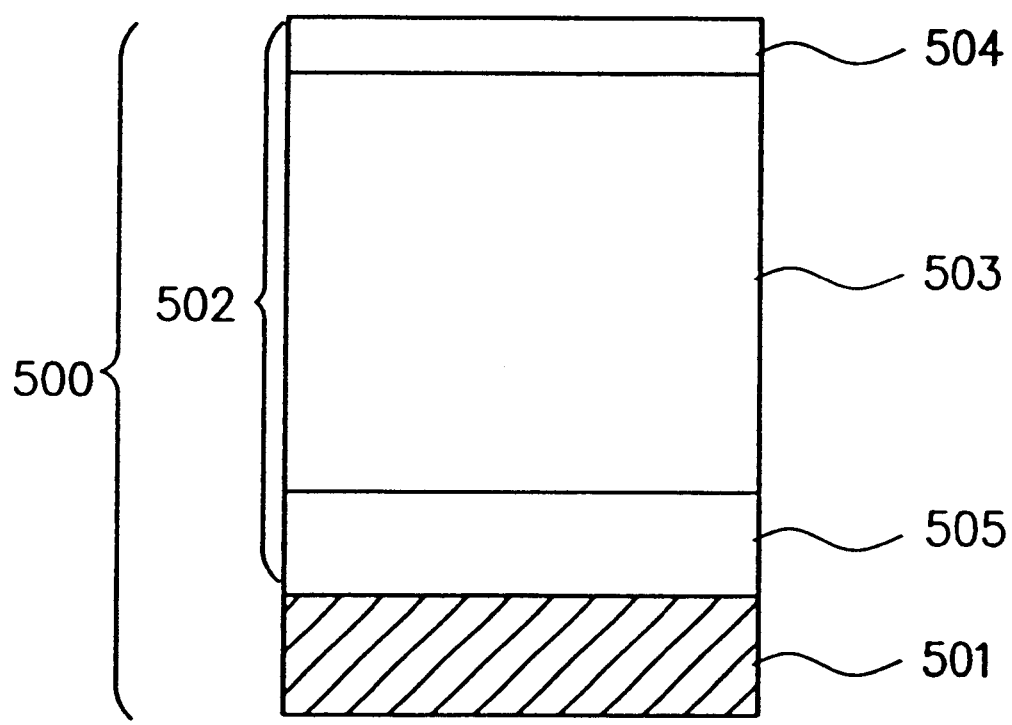
FIG. 6 is a schematic cross-sectional view illustrating the configuration of an example of a light receiving member as an electrophotographic light receiving member produced according to the present invention.

FIG. 6 is a schematic cross-sectional view illustrating the configuration of an example of a light receiving member as an electrophotographic light receiving member produced according to the present invention.

In FIG. 6, reference numeral 500 indicates a light receiving member comprising a light receiving layer 502 provided on a substrate 501. The light receiving layer 502 basically comprises a photoconductive layer 503 comprising an amorphous silicon material containing silicon atoms (Si) as a matrix and hydrogen atoms (H) or/and halogen atoms (X) [that is, a-Si:H,X material] and having photoconductivity and a surface layer 504 comprising an amorphous material such as an amorphous silicon material or an amorphous carbon material.

If necessary, the light receiving layer 502 may be provided with a charge injection inhibition layer 504 comprising an amorphous silicon material which is interposed between the substrate 501 and the photoconductive layer 503.

In the following, description will be made of each constituent of the light receiving member shown in FIG. 6.

Substrate

The substrate 501 may be either electrically conductive or electrically insulative. The electrically conductive substrate can include, for example, metals such as Al, Cr, Mo, Au, In, Nb, Te, V, Ti, Pt, Pd and Fe; and alloys of these metals such as stainless steel and the like. The electrically insulative substrate can include, for example, films or sheets of synthetic resins such as polyester, polyethylene, polycarbonate, cellulose acetate, polypropylene, polyvinyl chloride, polystyrene and polyamide; glass and ceramics. For the electrically insulative substrate, it is desired that at a surface thereof on which a film is to be deposited is applied with electroconductive treatment.

For the configuration of the substrate, in the above, description has been made of an embodiment in which the substrate in a cylindrical form. However, this is not limitative. Besides, the substrate may be in a belt-like form.

When image-recording is conducted using coherent light such as laser beam or the like, the substrate 501 may be designed to have an uneven surface on which the light receiving layer is to be provided, in order to effectively prevent occurrence of defective images based on interference fringe patterns. The formation of such uneven surface for the substrate may be conducted in accordance with a conventional manner disclosed in U.S. Pat. No. 4,650,736, U.S. Pat. No. 4,696,844 or U.S. Pat. No. 4,705,733.

Besides, in order to effectively prevent occurrence of defective images based on interference fringe patterns, it is possible for the substrate 501 to have an uneven surface provided with a plurality of spherical dimples on which the light receiving layer is to be provided. Specifically, the uneven surface of the substrate in this case comprises a plurality of minute irregularities having a magnitude which is smaller the resolution power required for the light receiving member 500, where the irregularities are based on a plurality of spherical dimples. The formation of such uneven surface provided with such spherical dimples as above described for the substrate 501 may be conducted by a conventional manner disclosed in U.S. Pat. No. 4,735,883.

Photoconductive Layer

As the film-forming raw material gas in order to form an amorphous silicon (a-Si:H,X) film as the photoconductive layer 503, an appropriate Si-supplying raw material gas is used. Such Si-supplying raw material gas can include, for example, gaseous or easily gasifiable silicon hydrides (silanes) such as $SiH_4$, $Si_2H_6$, $Si_3H_8$, and $Si_4H_{10}$. Besides, gaseous or easily gasifiabe fluorine-containing silicon compounds are also usable as the Si-supplying raw material gas. Specific examples are fluorine-substituted silane derivatives such as $SiF_4$ and $Si_2F_6$, and fluorine-substituted silicon hydride derivatives such as $SiH_3F$, $SiH_2F_2$, and $SiHF_3$. Of these, $SiH_4$ and $Si_2H_6$ are particularly preferred in view of easy handling upon the layer formation and good efficiency for the supply of Si.

If necessary, any of these Si-supplying compounds as the film-forming raw material gas may be used while being diluted with $H_2$ gas or inert gas such as He, Ar, or Ne.

Further, if necessary, the foregoing amorphous silicon film as the photoconductive layer may contain a conductivity controlling element belonging to group IIIb or group Vb of the periodic table. In this case, a gaseous or easily gasifiable compound capable of supplying such group IIIb or Vb element is used in addition to the foregoing film-forming raw material gas. Such compound capable of supplying the group IIIb element can include, for example, boron hydrides such as $B_2H_6$ and $B_4H_{10}$, and boron halides such as $BF_3$ and $BCl_3$. Such compound capable of supplying the group Vb element can include, for example, phosphorous hydrides such as $PH_3$ and $P_2H_4$, and phosphorous halides such as $PH_4I$, $PF_3$, $PCl_3$, $PBr_3$, and $PI_3$.

For the thickness of the photoconductive layer 503, it should be adequately determined in a viewpoint of attaining desired electrophotographic characteristics for the photoconductive layer and also in terms of economical advantages. However, in general, it is preferably in a range of 15 to 50 $\mu$m, more preferably in a range of 20 to 45 $\mu$m, most preferably in a range of 25 to 40 $\mu$m.

In order for the photoconductive layer 503 to be formed to have desired characteristics, the related parameters such as the mixing ratio between the Si-supplying raw material gas and the dilution gas, the gas pressure in the reaction chamber, the discharging power and the substrate temperature are adequately controlled upon the formation of the photoconductive layer.

For the flow rate of $H_2$ gas or/and inert gas used as the dilution gas, it should be properly determined within an optimum range in accordance with the design of the layer. However, in general, it is desired to be controlled preferably in a range of 1 to 20 times, more preferably in a range of 2 to 15 times, most preferably in a range of 3 to 10 times, respectively versus the flow rate of the Si-supplying raw material gas.

For the gas pressure in the reaction chamber, it should be properly determined within an optimum range in accordance with the design of the layer and the configuration of the apparatus. However, in general, it is preferably in a range of $1\times10^{-4}$ to 10 Torr, more preferably in a range of $5\times10^{-4}$ to 5 Torr, most preferably in a range of $1\times10^{-3}$ to 1 Torr.

For the discharging power, it should be properly determined within an optimum range in accordance with the design of the layer and the configuration of the apparatus. However, in general, the ratio (W/cc) of discharging power to the flow rate of the Si-supplying raw material gas is desired to be preferably in a range of 2 to 20, more preferably in a range of 2.5 to 10, or most preferably in a range of 3 to 5.

For The substrate temperature, it should be properly determined within an optimum range in accordance with the design of the layer. However, in general, it is desired to be preferably in a range of 200 to 350° C., more preferably in a range of 230 to 330° C., most preferably in a range of 250 to 310° C.

The conditions for the formation of the photoconductive layer 503 are determined within the above described ranges. However, the actual conditions such as the substrate temperature, the discharging power, and the gas pressure in the reaction chamber cannot usually be determined with ease independent of each other. Accordingly, the conditions optimum to the layer formation are desired to be properly determined based on relative and organic relationships for forming the photoconductive layer having desired characteristics.

Surface Layer

The surface layer 504 may be constituted by an appropriate amorphous material such as an amorphous silicon material or an amorphous carbon material.

Such amorphous silicon material can include various amorphous silicon materials. Specific preferable examples of such amorphous silicon material are amorphous silicon material containing carbon atoms (C), and hydrogen atoms (H) or/and halogen atoms (X) [that is, a-SiC:H,X], amorphous silicon material containing oxygen atoms (O), and hydrogen atoms (H) or/and halogen atoms (X) [that is, a-SiO:H,X], amorphous silicon material containing nitrogen atoms (N), and hydrogen atoms (H) or/and halogen atoms (X) [that is, a-SiN:H,X], and amorphous silicon material containing atoms (C,O,N), i.e., two or more kinds of atoms selected from the group consisting of carbon atoms (C), oxygen atoms (O) and nitrogen atoms (N), and hydrogen atoms (H) or/and halogen atoms (X) [that is, a-SiCON:H,X]. Specific preferable example of such amorphous carbon material is an amorphous carbon material containing carbon atoms as a matrix [that is, a-C].

In order for the surface layer 503 to be formed to have desired characteristics, the related parameters are adequately controlled upon the formation of the surface layer as well as in the case of forming the photoconductive layer. However, in view of productivity of a light receiving member, it is desired for the surface layer to be formed in the same film-forming manner employed in the formation of the photoconductive layer.

In any case, the formation of the surface layer 503 comprising any of the foregoing amorphous silicon materials is conducted by using a film-forming raw material gas comprising an appropriate Si-supplying raw material gas and an appropriate raw material gas capable of supplying at least one kind of atoms selected from the group consisting of carbon atoms (C), nitrogen atoms (N) and oxygen atoms (O) [the raw material gas capable of supplying carbon atoms will be hereinafter referred to as "C-supplying raw material gas", and the raw material gas capable of supplying nitrogen atoms (N) or/and oxygen atoms (O) will be hereinafter referred to as "(N,O)-supplying raw material gas].

Such Si-supplying raw material gas can include, for example, gaseous or easily gasifiable silicon hydrides (silanes) such as $SiH_4$, $Si_2H_6$, $Si_3H_8$, and $Si_4H_{10}$. Besides, gaseous or easily gasifiabe fluorine-containing silicon compounds are also usable as the Si-supplying raw material gas. Specific examples are fluorine-substituted silane derivatives such as $SiF_4$ and $Si_2F_6$, and fluorine-substituted silicon hydride derivatives such as $SiH_3F$, $SiH_2F_2$, and $SiHF_3$. Of these, $SiH_4$ and $Si_2H_6$ are particularly preferred in view of easy handling upon the layer formation and good efficiency for the supply of Si.

If necessary, any of these Si-supplying compounds as the film-forming raw material gas may be used while being diluted with $H_2$ gas or inert gas such as He, Ar, or Ne.

Specific examples of the C-supplying raw material gas are gaseous or easily gasifiable hydrocarbons such as $CH_4$, $C_2H_6$, $C_3H_8$, and $C_4H_{10}$. Of these, $CH_4$ and $C_2H_6$ are particularly preferred in view of easy handling upon the layer formation and good efficiency for the supply of C.

If necessary, any of these C-supplying compounds may be used while being diluted with $H_2$ gas or inert gas such as He, Ar, or Ne.

Specific examples of the (N,O)-supplying raw material gas are $N_2$, $NH_3$, NO, $N_2O$, $O_2$, CO, and $CO_2$. If necessary, any of these (N,O)-supplying compounds may be used while being diluted with $H_2$ gas or inert gas such as He, Ar, or Ne.

In the case of forming the surface layer comprising the foregoing amorphous carbon material, any of the above mentioned hydrocarbons is used as the film-forming raw material gas.

If necessary, the surface layer 504 may contain a conductivity controlling element belonging to group IIIb or group Vb of the periodic table. In this case, a gaseous or easily gasifiable compound capable of supplying such group IIIb or Vb element is used in addition to the foregoing film-forming raw material gas. Such compound capable of supplying the group IIIb element can include, for example, boron hydrides such as $B_2H_6$ and $B_4H_{10}$, and boron halides such as $BF_3$ and $BCl_3$. Such compound capable of supplying the group Vb element can include, for example, phosphorous hydrides such as $PH_3$ and $P_2H_4$, and phosphorous halides such as $PH_4I$, $PF_3$, $PCl_3$, $PBr_3$, and $PI_3$.

For the thickness of the surface layer 504, it is preferably in a range of 0.01 to 3 μm, more preferably in a range of 0.05 to 2 μm, most preferably in a range of 0.1 to 1 μm. When the thickness is less than 0.01 μm, a problem is liable to entail in that the surface layer is sometimes lost due to abrasion or the like during the repeated use of the light receiving member. When the thickness is beyond 3 μm, a problem is liable to entail in that deterioration of the characteristics such as an increase in the residual potential is sometimes occurred.

Charge Injection Inhibition Layer

In the light receiving member 500, it is more effective to interpose, between the substrate 501 and the photoconductive layer 503, a charge injection inhibition layer 505 capable of preventing a charge from injecting into the photoconductive layer from the substrate side. The charge injection inhibition layer 505 is desired to comprise an amorphous silicon material containing at least hydrogen atoms (H) or/and halogen atoms (X), and atoms of a conductivity controlling element.

The charge injection inhibition layer 505 has a so-called polarity-dependent property such that it functions to prevent a charge from injecting into the photoconductive layer from the substrate side when the free surface of the light receiving layer 502 is subjected to charging with a certain polarity, and it exhibits no such function when subjected to charging with a reverse polarity.

In order for the charge injection inhibition layer 505 to have such property as above described, atoms of an appropriate element capable of controlling the conductivity (the atoms will be hereinafter referred to as "conductivity controlling atoms") are contained in the charge injection inhibition layer in a relatively large amount in comparison with that of the conductivity controlling atoms to be optionally contained in the photoconductive layer 503.

The conductivity controlling atoms may be contained in the charge injection inhibition layer such that they are uniformly distributed in the entire layer region or they are unevenly distributed in the layer thickness direction in a partial layer region. In the latter case where the distribution concentration of the conductivity controlling atoms is uneven, it is desired for the conductivity controlling atoms to be largely distributed on the side of the substrate. However, in any case, in order to uniform the properties in the in-plane direction parallel to the surface of the substrate, it is necessary for the conductivity controlling atoms to be evenly contained at a uniform concentration distribution in the in-plane direction.

The foregoing conductivity controlling element can include so-called impurities in the field of semiconductor. Specifically, the conductivity controlling element can include, for example, elements capable of imparting p-type conductivity which belong to group IIIb of the periodic table (this element will be hereinafter referred to as "group IIIb element") and elements capable of imparting n-type conductivity which belong to group Vb of the periodic table (this element will be hereinafter referred to as "group Vb element").

Specific examples of the group IIIb element are boron (B), aluminum (Al), gallium (Ga), indium (In), and thallium (Tl). Of these, B, Al and Ga are particularly preferred.

Specific examples of the group Vb element are phosphorous (P), arsenic (As), antimony (Sb), and bismuth (Bi). Of these, P and As are particularly preferred.

The amount of the atoms of a given conductivity controlling element selected from those above mentioned contained in the charge injection inhibition layer should be adequately determined depending upon the situation involved. However, in general, it is preferably in a range of 10 to $1\times10^4$ atomic ppm, more preferably in a range of 50 to $5\times10^3$ atomic ppm, or most preferably in a range of $1\times10^2$ to $3\times10^3$ atomic ppm.

In order to further improve the adhesion between the charge injection inhibition layer and other layer provided in direct contact therewith, it is possible for the charge injection inhibition layer to contain at least one kind of atoms selected from the group consisting of carbon atoms (C), nitrogen atoms (N) and oxygen atoms (O) [this atoms will be hereinafter referred to as atoms (C,N,O)]. The atoms (C,N,O) may be contained in the charge injection inhibition layer such that they are uniformly distributed in the entire layer region or they are unevenly distributed in the layer thickness direction in a partial layer region. However, in any case, in order to uniform the properties in the in-plane direction parallel to the surface of the substrate, it is necessary for the atoms (C,N,O) to be evenly contained at a uniform concentration distribution in the in-plane direction.

The thickness of the charge injection inhibition layer 505 should be adequately determined from the viewpoints of achievement of the desired electrophotographic characteristics and of economical advantages. However, in general, it is preferably in a range of 0.1 to 5 μm, more preferably in a range of 0.3 to 4 μm or most preferably in a range of 0.5 to 3 μm.

The charge injection inhibition layer 505 may be formed in the same manner in the case of forming the photoconductive layer 503. Particularly, in order to form the charge injection inhibition layer 505 having desired properties, as well as in the case of forming the photoconductive layer 503, the related parameters such as the mixing ratio between the Si-supplying raw material gas and dilution gas, the gas pressure in the reaction chamber, the discharging power and the substrate temperature are adequately controlled upon the formation of the charge injection inhibition layer.

For the flow rate of $H_2$ gas and/or inert gas used as the dilution gas, it should be properly determined within an optimum range in accordance with the design of the layer. However, in general, it is desired to be controlled preferably in a range of 1 to 20 times, more preferably in a range of 3 to 15 times, or most preferably in a range of 5 to 10 times, respectively versus the flow rate of the Si-supplying raw material gas.

For the gas pressure in the reaction chamber, it should be properly determined within an optimum range in accordance with the design of the layer and the configuration of the apparatus. However, in general, it is preferably in a range of $1\times10^{-4}$ to 10 Torr, more preferably in a range of $5\times10^{-4}$ to 5 Torr, or most preferably in a range of $1\times10^{-3}$ to 1 Torr.

For the discharging power, it should be properly determined within an optimum range in accordance with the design of the layer and the configuration of the apparatus. However, in general, the ratio (W/cc) of discharging power to the flow rate of the Si-supplying raw material gas is desired to be preferably in a range of 1 to 7, more preferably in a range of 2 to 6, or most preferably in a range of 3 to 5.

For the substrate temperature, it should be properly determined within an optimum range in accordance with the design of the layer. However, in general, it is preferably in a range of 200 to 350° C., more preferably in a range of 230 to 330° C., or most preferably in a range of 250 to 310° C.

As above described, the present invention can be employed in the production of a light receiving member having such configuration as shown in FIG. 5 which can be used in an electrophotographic copying machine or printer. But this is not limitative. The present invention can be also employed in the production of other semiconductor devices such as high-resistance type light receiving members and function-divided type light receiving members which are used in an electrophotographic copying machine or printer.

In the following, the features and advantages of the present invention will be described with reference to examples. It should be understood that these examples are not intended to restrict the scope of the present invention.

EXAMPLE 1 AND COMPARATIVE EXAMPLE 1

Example 1

Using the apparatus shown in FIG. 1, the period of time spent in the process wherein the reaction chamber 1100 provided in the loading stage 1201 was separated from the loading stage, followed by moving the reaction chamber in the transfer stage 1202, and the reaction chamber was joined to the film-forming stage 1203 where plasma was produced by introducing raw material gas was measured. Particularly, 10 operators (A to J) were separately engaged in this work, and said period of time was measured for each operator. In any case, the distance between the loading stage and the film-forming stage was made to be the same. The results obtained are shown in Table 1.

Comparative Example 1

Using the apparatus shown in FIG. 3, the period of time spent in the process wherein the reaction chamber 2100 provided in the loading stage 2101 was separated from the loading stage, followed by moving the reaction chamber in the transfer stage 2102, and the reaction chamber was joined to the film-forming stage 2103 where plasma was produced by introducing raw material gas was measured. Particularly, 10 operators (A to J) were separately engaged in this work, and said period of time was measured for each operator. In any case, the distance between the loading stage and the film-forming stage was made to be the same. The results obtained are shown in Table 1.

Based on the results shown in Table 1, the following facts are understood. That is, the period of time required from the time when the reaction chamber is separated from the loading stage until the time when the reaction chamber is joined to the film-forming stage in Example 1 is apparently shorter than that in Comparative Example 1. And the differential time depending on the operator is apparently smaller than that in Comparative Example 1.

Example 2

Using the apparatus shown in FIG. 1, six well-cleaned cylindrical aluminum substrates of 80 mm in outer diameter, 5 mm in thickness and 358 mm in length having a mirror-finished surface were set to the reaction chamber 1100 in the loading stage 1201 as previously described. And following the procedures previously described for the apparatus shown in FIG. 1, there were sequentially formed a charge injection inhibition layer, a photoconductive layer and a surface layer on each of the six cylindrical substrates under conditions shown in Table 2. Thus, there were obtained six amorphous silicon cylindrical electrophotographic light receiving members having such configuration as shown in FIG. 6 (the cylindrical electrophotographic light receiving member will be hereinafter simply referred to as "electrophotographic light receiving drum"). This operation of forming the six electrophotographic light receiving drums was continuously repeated 30 times.

Each of the resultant electrophotographic light receiving drums was set to an electrophotographic copying machine NP 6750 which has been modified to be usable for experimental purposes (produced by Canon Kabushiki Kaisha), where the electrophotographic light receiving drum was evaluated with respect to photosensitivity in the following manner.

Evaluation of the Photosensitivity

The electrophotographic light receiving drum is subjected to charging so as to provide a given surface potential in dark therefor, followed by subjecting to irradiation of light from a Xenon lamp while excluding light having a wavelength of more than 600 nm by means of a cut-filter where the surface potential in light of the electrophotographic light receiving drum is measured by means of an electrostatic voltmeter. And the quantity of exposure light is so adjusted that the surface potential in light becomes to be a given value. The quantity of the exposure light used in this case is made to be a photosensitivity of the electrophotographic light receiving drum. Particularly, in this case, the quantity of exposure light required to attain an identical surface potential in light is evaluated. In other words, the smaller the quantity of exposure light, the greater the photosensitivity.

In this way, each of the resultant electrophotographic light receiving drums was evaluated with respect to the photosensitivity. The evaluated results obtained are graphically shown in FIG. 7 in terms of a variation from the standard value.

Comparative Example 2

Using the apparatus shown in FIG. 3, six well-cleaned cylindrical aluminum substrates of 80 mm in outer diameter, 5 mm in thickness and 358 mm in length having a mirror-finished surface were set to the reaction chamber 2100 in the loading stage 2101. And following the procedures previously described for the apparatus shown in FIG. 3, there were sequentially formed a charge injection inhibition layer, a photoconductive layer and a surface layer on each of the six cylindrical substrates under conditions shown in Table 2. Thus, there were obtained six amorphous silicon cylindrical electrophotographic light receiving members having such configuration as shown in FIG. 6 (the cylindrical electrophotographic light receiving member will be hereinafter simply referred to as "electrophotographic light receiving drum"). This operation of forming the six electrophotographic light receiving drums was continuously repeated 30 times.

Each of the resultant electrophotographic light receiving drums was evaluated with respect to its photosensitivity in the same manner as in Example 1.

Figure 8:
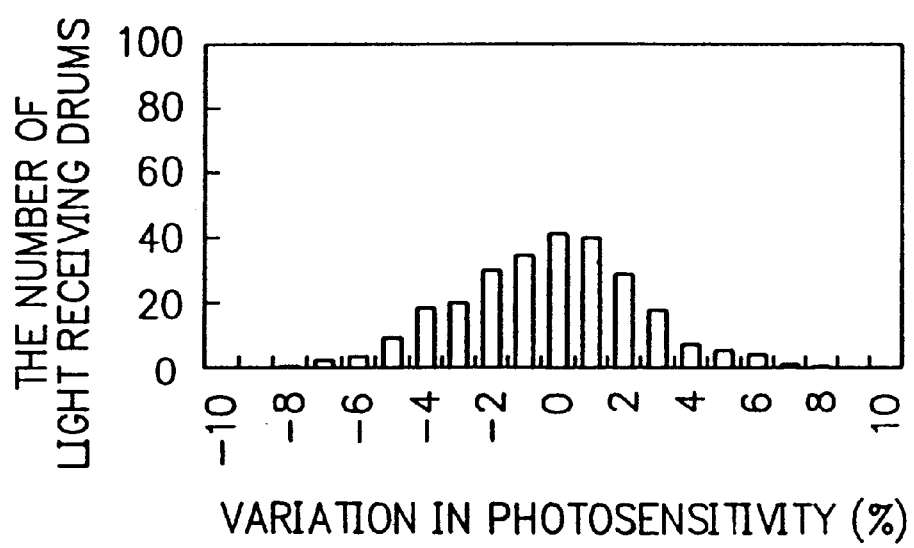
FIG. 8 shows a graph of evaluated results with respect to sensitivity for light receiving member (as electrophotographic light receiving members) obtained in Comparative Example 2 which will be described later.

The evaluated results obtained are graphically shown in FIG. 8 in terms of a variation from the standard value.

Figure 7:
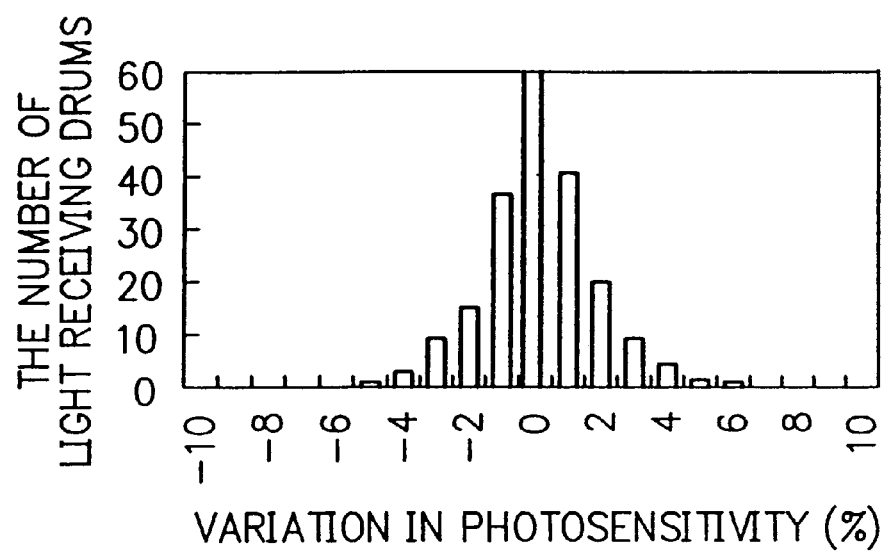
FIG. 7 shows a graph of evaluated results with respect to sensitivity for light receiving member (as electrophotographic light receiving members) obtained in Example 2 which will be described later.

Based on the results shown in FIG. 7 (Example 2) and FIG. 8 (Comparative Example 2), it is understood that the electrophotographic light receiving drums obtained in Example 2 are surpassing those obtained in Comparative Example 2 in terms of the variation in the photosensitivity.

EXAMPLE 3 AND COMPARATIVE EXAMPLE 3

Example 3

The procedures of Example 2 were repeated, except that at the same time of controlling the temperature of the cylindrical substrates in the reaction chamber on the travelling rail 1104 in the transfer stage 1202 to 200° C. through the travelling rail, the inner wall of the reaction chamber and the high frequency power application electrode were controlled to have a temperature 200° C. by also supplying an electric power to these through the travelling rail, to obtain a number of amorphous silicon electrophotographic light receiving drums.

Comparative Example 3

The procedures of Example 2 were repeated, except that the temperature of the cylindrical substrates in the reaction chamber on the travelling rail 1104 in the transfer stage 1202 was controlled to 200° C. but the inner wall of the reaction chamber and the high frequency power application electrode were not controlled with respect to their temperature as in Example 3, to obtain a number of amorphous silicon electrophotographic light receiving drums.

Evaluation

Each of the electrophotographic light receiving drums obtained in Example 3 and Comparative Example 3 was set to the foregoing electrophotographic copying machine and the electrophotographic light receiving drum was evaluated with respect to (1) temperature-dependent charge retentivity and (2) appearance of defective image in the following manner.

Evaluation of the Temperature-dependent Charge Retentivity

The electrophotographic light receiving drum is subjected to charging so as to provide a given surface potential in dark therefor, and while changing the temperature of the electrophotographic light receiving drum from room temperature to about 45° C., where the rate of change in the charge retentivity per the temperature of 1° C. is measured.

Evaluation of the Appearance of Defective Image

A halftone test chart FY9-9042 (produced by Canon Kabushiki Kaisha) is position on the original table of the copying machine and it is subjected to image reproduction to obtain a reproduced image. For the reproduced image, the number of white dot(s) having a diameter of less than 0.5 mm present in a given area.

As a result, it was found that the electrophotographic light receiving drums obtained in Example 3 are surpassing those obtained in Comparative Example 3 by about 20% with respect to each of the evaluation items (1) and (2).

EXAMPLE 4 AND COMPARATIVE EXAMPLE 4

Example 4

There were provided (a) a plurality of reaction chambers having such constitution as shown in FIG. 5(A) each containing nine well-cleaned cylindrical aluminum substrates of 80 mm in outer diameter, 5 mm in thickness and 358 mm in length having a mirror-finished surface arranged as shown in FIGS. 5(A) and (b) a plurality of reaction chambers having such constitution as shown in FIG. 5(B) each containing nine well-cleaned cylindrical aluminum substrates of 60 mm in outer diameter, 5 mm in thickness and 358 mm in length having a mirror-finished surface arranged as shown in FIG. 5(B).

In the apparatus shown in FIG. 1, using alternatively one of the reaction chambers (a) and one of the reaction chambers (b), as well as in Example 2, there were sequentially formed a charge injection inhibition layer, a photoconductive layer and a surface layer on each cylindrical substrate under conditions shown in Table 2 to obtain an amorphous silicon cylindrical electrophotographic light receiving drum having such configuration as shown in FIG. 6. The cycle of producing amorphous silicon cylindrical electrophotographic light receiving drums was continuously repeated 30 times, where the amorphous silicon cylindrical electrophotographic light receiving drums produced in the previous cycle were different from those produced in the successive cycle in terms of the diameter. Thus, there were continuously produced a number of amorphous silicon cylindrical electrophotographic light receiving drums having a different diameter.

Comparative Example 4

The procedures of Example 4 were repeated, except that the apparatus shown in FIG. 3 was used, to continuously produce a number of amorphous silicon cylindrical electrophotographic light receiving drums having a different diameter.

As a result of having compared Example 4 with Comparative Example 4, there was found the following fact. That is, the period of time spent for the production of the amorphous silicon cylindrical electrophotographic light receiving drums in the same number as in Example 4 including the work required for the stage replacement was about 1.5 times that in Example 4.

As will be understood from the above description, the present invention has such advantages as will be described below.

Desirable plasma processing (for instance, mass-production of light receiving members) can be effectively conducted at an improved production tact time. Further, by energizing the travelling rail and controlling the temperature of the substrate using the electric power, the temperature of the substrate in the reaction chamber during the time when the reaction chamber is moved is prevented from being changed, where the substrate temperature upon the commencement of plasma processing (for instance, film formation) is prevented from being varied depending on each lot and because of this, a variation among the products with respect to their characteristics can be desirably diminished. In addition, by controlling the temperature of the inner wall of the reaction chamber and that of the inside constituents of the reaction chamber including high frequency power application electrode, there can be attained an improvement in the adhesion of a film deposited in the inside of the reaction chamber and a decrease in the amount of impurities due to the baking effect. And although the case is not clear, there can be mass-produced amorphous silicon light receiving drums which provide slight defective image and have an improved temperature-dependent charge retentivity. Further, desirable plasma processing can be continuously and effectively conducted for substrates at a reasonable cost. And a variety of high quality amorphous silicon light receiving drums whose diameter being different can be mass-produced at a reasonable cost.

TABLE 1

| | operators | | | | | | | | | | | |
|---|---|---|---|---|---|---|---|---|---|---|---|---|
| | A | B | C | D | E | F | G | H | I | J | average | XδT |
| Example 1 (hours) | 29.5 | 29.6 | 30.0 | 29.8 | 29.9 | 30.0 | 29.5 | 29.5 | 29.6 | 29.9 | 29.7 | 0.5 |
| Comparative Example 1 (hours) | 42.5 | 45.0 | 48.0 | 48.0 | 46.7 | 50.8 | 43.6 | 44.4 | 52.5 | 48.2 | 47.0 | 10.0 |

XδT = maximum time spent − minimum time spent

TABLE 2

| | charge injection inhibition layer | | photo-conductive layer | | surface layer | |
|---|---|---|---|---|---|---|
| raw material gas used and its flow rate | $SiH_4$ | 300 | $SiH_4$ | 300 | $SiH_4$ | 30 |
| | $H_2$ | 100 | $B_2H_6$ | 1.5 ppm | $H_2$ | 100 |
| | $B_2H_6$ | 500 ppm | (against $SiH_4$) | | $CH_4$ | 500 |
| | (against $SiH_4$) | | | | | |
| high frequency power (W) | 3000 | | 3000 | | 3000 | |
| oscillation frequency | 105 MHz | | 105 MHz | | 105 MHz | |
| gas pressure in the | 10 | | 10 | | 10 | |

TABLE 2-continued

|  | charge injection inhibition layer | photo-conductive layer | surface layer |
|---|---|---|---|
| reaction chamber (mTorr) |  |  |  |

What is claimed is:

1. A plasma process apparatus comprising at least:

a loading stage for loading and evacuating a mobile reaction chamber, said mobile reaction chamber being evacuable and having therein (i) a high frequency power application electrode, (ii) a raw material gas introduction means, and (iii) a substrate temperature-controlling means for receiving a substrate, a treating stage for plasma-processing the substrate arranged in said reaction chamber, and a transportation track for moving said reaction chamber from said loading stage to said treating stage, said loading stage having an exhaust system which is detachably joined to said reaction chamber and said treating stage having a high frequency power supply system, a processing gas supply system and an exhaust system which are detachably joined to said reaction chamber.

2. The plasma processing apparatus according to claim 1, wherein the transportation track has an electric power supply means for supplying an electric power to the substrate temperature-controlling means to control the temperature of the substrate arranged in the reaction chamber.

3. The plasma processing apparatus according to claim 1, wherein the transportation track has an electric power supply means for supplying an electric power to the high frequency power application electrode to control the temperature of the high frequency power application electrode.

4. The plasma processing apparatus according to claim 1, wherein the transportation track has an electric power supply means for supplying an electric power to the reaction chamber to control the temperature of an inner wall of the reaction chamber.

5. The plasma processing apparatus according to claim 1, wherein the loading stage has a track for moving the reaction chamber to separate the reaction chamber from a loading position thereof in the loading stage and transfer the reaction chamber on the transportation track.

6. The plasma processing apparatus according to claim 1, wherein the treating stage has a track for receiving the reaction chamber transported by the transportation track, wherein the reaction chamber is moved on said track to a predetermined position in the treating stage.

7. The plasma processing apparatus according to claim 1, wherein a plurality of reaction chambers capable of being evacuated are sequentially loaded and having the substrate arranged therein in the loading stage.

* * * * *

UNITED STATES PATENT AND TRADEMARK OFFICE
CERTIFICATE OF CORRECTION

PATENT NO.     : 6,649,020 B1
DATED          : November 18, 2003
INVENTOR(S)    : Ryuji Okamura et al.

It is certified that error appears in the above-identified patent and that said Letters Patent is hereby corrected as shown below:

Title page,
Item [75], Inventors,
Reads: "Tatsuyuki Aoike, Nara-ken (JP);
Toshiyasu Shirasuna, Nara-ken (JP)
Kazuhiko Takada, Nara-ken (JP);
Kazuyoshi Akiyama, Nara-ken (JP)"
Should read;
-- Tatsuyuki Aoike, Nara (JP);
Toshiyasu Shirasuna, Nara (JP);
Kazuhiko Takada, Nara (JP);
Kazuyoshi Akiyama, Nara (JP) --.

Column 2,
Line 17, "in a" should read -- in an --.

Column 3,
Line 16, "smaller" should read -- small --;
Line 51, "film is" should read -- film that is --; and
Line 66, "capable being" should read -- capable of being --.

Column 4,
Line 39, "Further in addition," should read -- Further, in addition, --; and
Line 49, "such problem." should read -- such a problem. --.

Column 5,
Line 33, "row" should read -- raw --; and
Line 60, "means an" should read -- means of an --.

Column 6,
Line 24, "not" should be deleted;
Line 39, "row" should read -- raw --; and
Line 62, "means an" should read -- means of an --.

Column 8,
Line 9, "for" should be deleted.

Column 9,
Line 40, "substrate in" should read -- substrate is in --; and
Line 58, "smaller the" should read -- smaller than the --.

UNITED STATES PATENT AND TRADEMARK OFFICE
CERTIFICATE OF CORRECTION

PATENT NO.    : 6,649,020 B1
DATED         : November 18, 2003
INVENTOR(S)   : Ryuji Okamura et al.

It is certified that error appears in the above-identified patent and that said Letters Patent is hereby corrected as shown below:

Column 10,
Line 65, "The" should read -- the --.

Column 15,
Line 37, "has" should read -- had --; and
Line 52, "becomes" should read -- comes --.

Column 17,
Line 10, "in a given area." should read -- in a given area indicates number of defects. --.

Column 19,
Line 11, "process" should read -- processing --.

Signed and Sealed this

Twenty-second Day of June, 2004

JON W. DUDAS
*Acting Director of the United States Patent and Trademark Office*